(12) United States Patent
Chen et al.

(10) Patent No.: US 12,469,766 B2
(45) Date of Patent: Nov. 11, 2025

(54) POWER SEMICONDUCTOR DEVICE

(71) Applicant: Hitachi, Ltd., Tokyo (JP)

(72) Inventors: Ti Chen, Tokyo (JP); Takeshi Tokuyama, Tokyo (JP); Akihiro Namba, Tokyo (JP); Takahiro Araki, Tokyo (JP); Masanori Sawahata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 429 days.

(21) Appl. No.: 18/026,270

(22) PCT Filed: Sep. 17, 2021

(86) PCT No.: PCT/JP2021/034343
§ 371 (c)(1),
(2) Date: Mar. 14, 2023

(87) PCT Pub. No.: WO2022/070993
PCT Pub. Date: Apr. 7, 2022

(65) Prior Publication Data
US 2023/0361001 A1   Nov. 9, 2023

(30) Foreign Application Priority Data

Oct. 1, 2020   (JP) .................................. 2020-167143

(51) Int. Cl.
*H01L 23/473* (2006.01)
*H01L 23/31* (2006.01)
(Continued)

(52) U.S. Cl.
CPC ........ *H01L 23/473* (2013.01); *H01L 23/3121* (2013.01); *H01L 25/16* (2013.01);
(Continued)

(58) Field of Classification Search
CPC ... H01L 23/473; H01L 23/3121; H01L 25/16; H01L 24/32; H01L 24/33;
(Continued)

(56) References Cited

U.S. PATENT DOCUMENTS

| 7,071,550 B2 * | 7/2006 | Sato ..................... H01L 25/165 |
| | | 257/796 |
| 2006/0033236 A1 * | 2/2006 | Brandenburg ........ H01L 23/473 |
| | | 257/E23.098 |
| 2006/0038284 A1 * | 2/2006 | Brandenburg ........ H01L 23/473 |
| | | 257/E23.098 |

FOREIGN PATENT DOCUMENTS

JP   2016-119427 A   6/2016

OTHER PUBLICATIONS

English Machine Translation of JP 2016119427, Yamagashi T., Electronic Apparatus, published Jun. 30, 2016.*

(Continued)

*Primary Examiner* — Peniel M Gumedzoe
(74) *Attorney, Agent, or Firm* — Crowell & Moring LLP (57) ABSTRACT

A power semiconductor device according to the present invention is provided with a conductive section, a circuit component, a substrate that supports the conductive section and the circuit component, and a sealing member, wherein the sealing member forms a first flow path, and the first flow path has a first region thermally connected to a power circuit and a second region thermally connected to the circuit component.

14 Claims, 6 Drawing Sheets

(51) Int. Cl.
*H01L 25/16* (2023.01)
*H01L 23/00* (2006.01)

(52) U.S. Cl.
CPC .............. *H01L 24/32* (2013.01); *H01L 24/33* (2013.01); *H01L 2224/32245* (2013.01); *H01L 2224/33181* (2013.01); *H01L 2924/13055* (2013.01); *H01L 2924/13091* (2013.01)

(58) Field of Classification Search
CPC . H01L 2224/32245; H01L 2224/33181; H01L 2924/13055; H01L 2924/13091
See application file for complete search history.

(56) References Cited

OTHER PUBLICATIONS

International Search Report (PCT/ISA/210) issued in PCT Application No. PCT/JP2021/034343 dated Nov. 16, 2021 with English translation (four (4) pages).
Japanese-language Written Opinion (PCT/ISA/237) issued in PCT Application No. PCT/JP2021/034343 dated Nov. 16, 2021 (three (3) pages).

\* cited by examiner

POWER SEMICONDUCTOR DEVICE

TECHNICAL FIELD

The present invention relates to a power semiconductor device.

BACKGROUND ART

In the field of electric vehicles, downsizing of motor inverters is required in order to maximize a battery mounting space. Along with down-sizing, in order to realize a small inverter having a higher output density, a structure having a small size and high cooling performance is required, so that technical improvements have been made.

As a background art of the present invention, the following PTL 1 is known. PTL 1 shows a configuration in which in a circuit board 10 of an electronic device 100, a molded resin 50 includes a flow path forming portion 53 that closes an opening 230 to form a part of a flow path 220, and a seal portion 52 in which an O-ring 400 is disposed at a position surrounding the flow path forming portion 53. The flow path forming portion 53 is attached to an attachment object 200 with the O-ring 400 sandwiched between the seal portion 52 and the attachment object 200 while closing the opening 230. There is disclosed a technique of an electronic device enabling heat dissipation to be secured without increasing the number of components by this configuration.

CITATION LIST

Patent Literature

PTL 1: JP 2016-119427 A

SUMMARY OF INVENTION

Technical Problem

In the conventional structure recited in PTL 1, it is necessary to increase an area required for sealing a refrigerant on a surface of a printed circuit board. As a result, when a distance between a capacitor and a driver circuit and a power module increases, there arises a concern that an inductance increases. Also in this case, it is necessary to separately add a flow path in order to cool a circuit component that generates heat, which may complicate the flow path and increase a size of the device.

In view of the foregoing, an object of the present invention is to provide a power semiconductor device enabling both low inductance and down-sizing to be realized by achieving both improvement in a mounting density of a circuit component and improvement in cooling performance.

Solution to Problem

A power semiconductor device according to the present invention includes: a power semiconductor element; a conductive section that transmits a main current of the power semiconductor element; a circuit component that passes the main current or a control current that controls the power semiconductor element; a substrate that supports the power semiconductor element, the conductive section, and the circuit component; and a sealing member that seals the power semiconductor element, the conductive section, the circuit component, and the substrate. The power semiconductor element and the conductive section constitute a power circuit that outputs an alternating current, the sealing member forms a first flow path for flowing a refrigerant, and the first flow path has a first region thermally connected to the power circuit, and a second region thermally connected to the circuit component.

Advantageous Effects of Invention

A power semiconductor device can be provided which enables both low inductance and down-sizing to be realized by achieving both improvement in a mounting density of a circuit component and improvement in cooling performance.

DESCRIPTION OF EMBODIMENTS

In the following, embodiments of the present invention will be described with reference to the drawings. The following description and drawings are examples for describing the present invention, and are omitted and simplified as appropriate for the sake of clarity of the description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

Embodiments of Present Invention and Configurations Thereof

Figure 1:
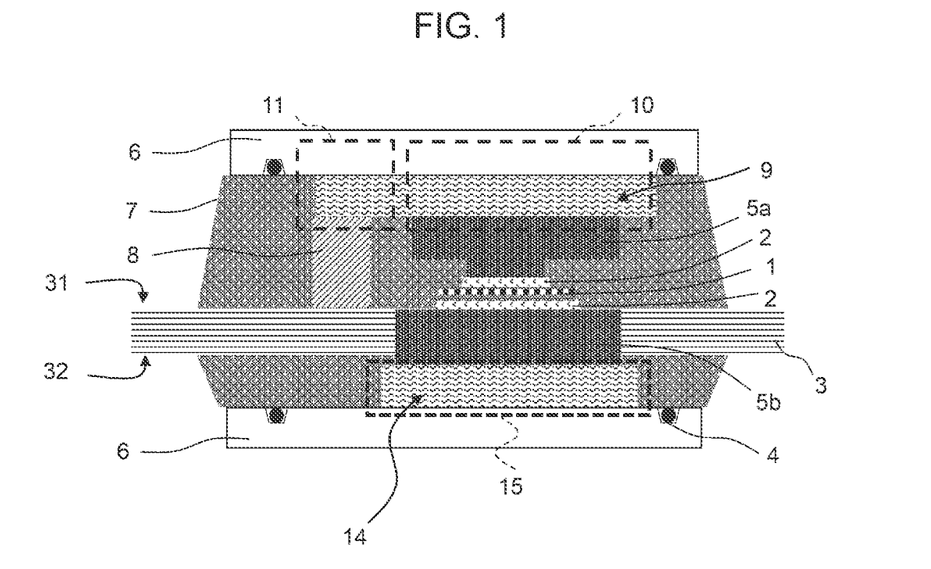
FIG. 1 is a view of a power semiconductor device according to a first embodiment of the present invention.

FIG. 1 is a view of a power semiconductor device according to a first embodiment of the present invention.

A power semiconductor element 1 is connected to conductive sections 5a and 5b via solder 2 to constitute a power circuit. The power semiconductor element 1 is, for example, a combination of an insulated gate bipolar transistor (IGBT) and a diode, or a metal-oxide-semiconductor field effect transistor (MOSFET).

The conductive sections 5a and 5b transmit a collector/emitter current which is a main current of the power semiconductor element 1. A circuit component 8 is configured with one or both of a capacitor circuit that smooths power and a driver circuit that outputs a gate current which is a control current.

A sealing member 7 is made of a material such as resin, and molds the power semiconductor element 1, the conductive sections 5a and 5b, and the circuit component 8 and fixes the same to the substrate 3 so as to be sealed. The power semiconductor element 1 and the conductive sections 5a and 5b form the power circuit, and are supported and disposed on the substrate 3.

The sealing member 7 forms a first flow path 9 and a second flow path 14. The first flow path 9 and the second flow path 14 cause a refrigerant to flow therethrough to cool the conductive sections 5a and 5b and the circuit component 8 that generate heat. In addition, the sealing member 7 fills a surface step of the substrate 3 with the molded resin to easily seal the refrigerant in the flow path.

The first flow path 9 is formed by the sealing member 7, the conductive section 5a, the circuit component 8, and a flow path case 6. The conductive section 5a has an exposed surface that is not covered with the sealing member 7 so as to be in contact with the refrigerant flowing in the first flow path 9. The conductive section 5a may be in direct contact with the refrigerant on this exposed surface, or may be covered with a filler sheet or the like of a heat conductive member for protection so as to be in indirect contact with the refrigerant.

The flow path case 6 is fixed by the sealing member 7 such that a surface of the flow path case comes into direct contact with the refrigerant, and is installed on a surface of the sealing member 7 on a side opposite to the substrate 3 side.

A seal member 4 is a member that is disposed in a groove provided in the sealing member 7 or in the flow path case 6, and that seals the refrigerant flowing inside the first flow path by connecting and fixing the flow path case 6 and the sealing member 7. The seal member 4 is configured by, for example, an O-ring or a gasket.

The substrate 3 is provided with a through hole for installing the circuit. In the substrate 3, a face on an upper side of the drawing is referred to as a first face 31, and a face on a lower side of the same is referred to as a second face 32.

In the first flow path 9, a region surrounded by the conductive section 5a, the sealing member 7, and the flow path case 6 is referred to as a first region 10, and a region surrounded by the circuit component 8, the sealing member 7, and the flow path case 6 is referred to as a second region 11. The first region 10 is a region thermally connected to the power semiconductor element 1 or the conductive section 5a. The second region 11 is a region having at least a part thereof formed by the sealing member 7 and a surface (exposed surface) of the circuit component 8 or the heat conductive member, and being thermally connected to the circuit component 8.

The circuit component 8 is fixed in the second region 11 by the sealing member 7 such that the surface of the circuit component is in contact with the refrigerant. The surface of the circuit component 8 is exposed from the sealing member 7 and forms a part of a bottom surface of the first flow path 9. A contact surface of the circuit component 8 with the refrigerant is covered with an interposed member so as not to be in direct contact with the refrigerant for component protection. The interposed member is, for example, a filler sheet of a heat conductive member. This improves an cooling effect of the circuit component 8. In addition, cooling performance can be further enhanced by installing the circuit component 8 in the flow path portion 9. In addition, since the circuit component 8 is installed near the power semiconductor element 1, inductance can be reduced.

In addition, the sealing member 7 forms the first flow path 9 on the first face 31 side of the substrate 3, and further forms the second flow path 14 on the second face 32 side of the substrate 3, and the second flow path 14 has a third region 15 thermally connected to the power circuit. As a result, while cooling the power circuit by the refrigerant from both surfaces, the circuit component 8 is simultaneously cooled by the first flow path 9, thereby improving the cooling effect while improving a mounting density. An exposed surface of the conductive section 5b, in the third region 15, being exposed to the flow path portion 14 may be coated using a heat conductive member so as to be indirectly cooled without being directly exposed to the refrigerant.

Figure 2:
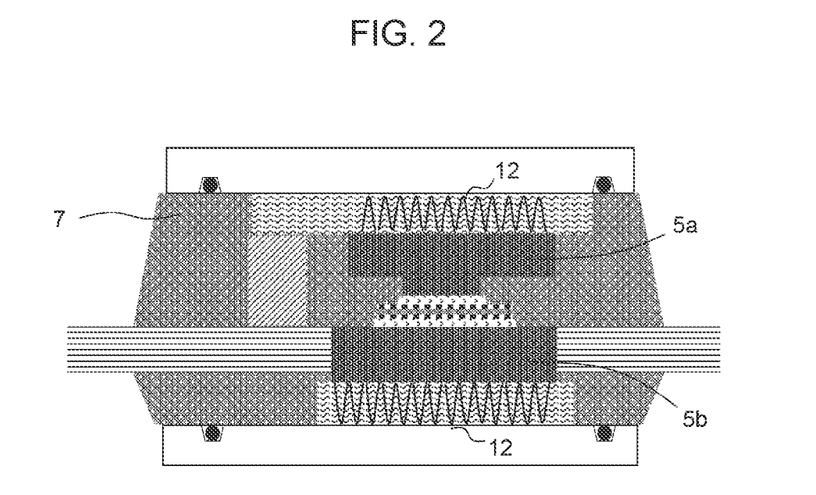
FIG. 2 is a view of a power semiconductor device according to a second embodiment of the present invention.

FIG. 2 is a view of a power semiconductor device according to a second embodiment of the present invention.

The conductive sections 5a and 5b each have the exposed surface that is exposed from the sealing member 7, and a wire portion (cooling wire) 12 having a bent portion is connected to the exposed surface. The cooling wires 12 are installed on the exposed surfaces of the conductive sections 5a and 5b in order to increase heat dissipation areas of the conductive sections 5a and 5b. As a result, the heat dissipation area is increased to improve the cooling effect. The cooling wires 12 are joined to the conductive sections 5a and 5b by a joining method such as ultrasonic joining, soldering, or resistance welding. The cooling wire 12 is made of a material such as aluminum, copper, or SUS.

Figure 3:
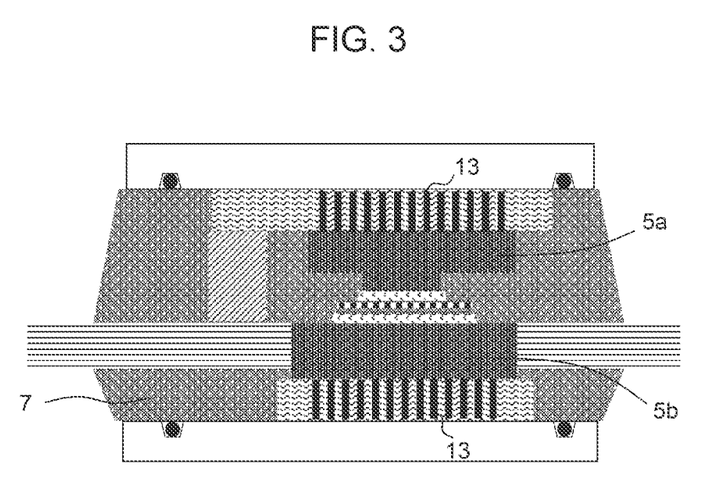
FIG. 3 is a view of a power semiconductor device according to a third embodiment of the present invention.

FIG. 3 is a view of a power semiconductor device according to a third embodiment of the present invention.

The conductive sections 5a and 5b have the exposed surfaces that are exposed from the sealing member 7, and pin fins (cooling fins) 13 are provided on the exposed surfaces. The cooling fins 13 are installed to increase the heat dissipation areas of the conductive sections 5a and 5b, and have a cylindrical shape, a prismatic shape, a plate shape, or the like. This increase in a heat dissipation area improves the cooling effect. In a case of a cylinder or a prism, each pin of the cooling fin 13 is preferably arranged in a zigzag manner or a lattice shape toward a flow of the refrigerant. The cooling fin 13 may be a member to be integrated with the conductive sections 5a and 5b by shaving the conductive sections 5a and 5b or casting using a mold, or may be configured by joining another member to the conductive sections 5a and 5b. FIG. 3 illustrates an example in which the cooling fin 13 is configured in a plate shape and is formed in parallel with the flow of the refrigerant.

Figure 4:
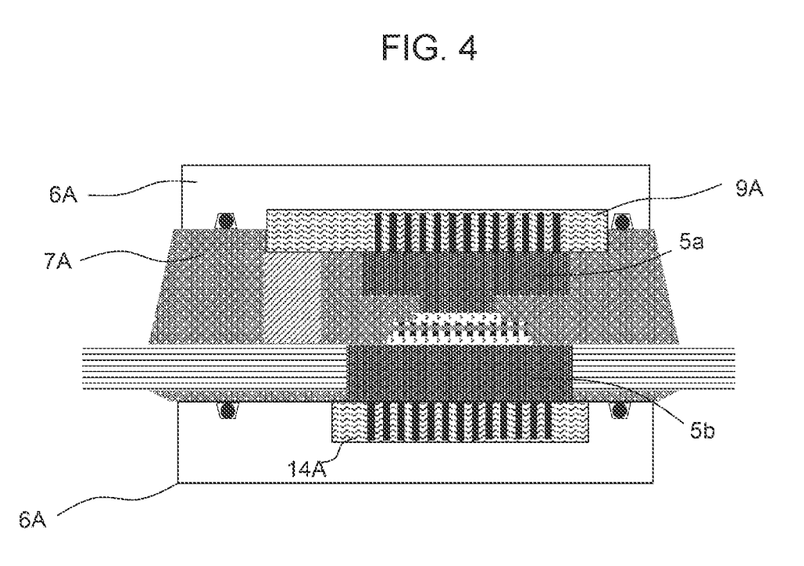
FIG. 4 is a view of a power semiconductor device according to a fourth embodiment of the present invention.

FIG. 4 is a view of a power semiconductor device according to a fourth embodiment of the present invention.

A first flow path 9A or a second flow path 14A is configured with a sealing member 7A and a flow path case 6A connected to the sealing member 7A. Specifically, as shown in FIG. 4, the sealing member 7A forms at least a part of a bottom surface of the first flow path 9A or the second flow path 14A, the flow path case 6A is formed in a recessed shape, and has an upper surface opposed to a bottom surface of the first flow path 9A or the second flow path 14A, and side surfaces connected to the upper surface. By forming both the sealing member 7A and the flow path case 6A to have a recessed shape, a flow path area of the refrigerant can be easily increased. This improves the cooling effect of the conductive sections 5a and 5b.

Figure 5:
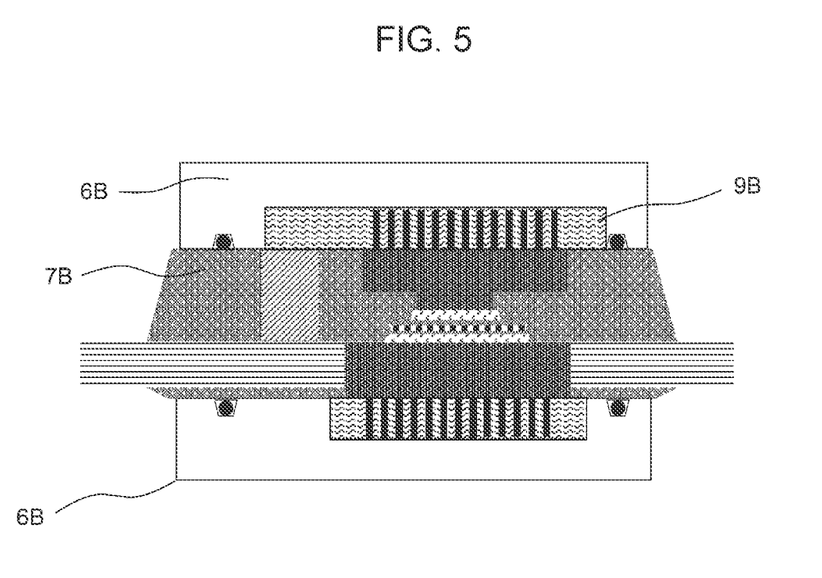
FIG. 5 is a modification of FIG. 4.

FIG. 5 is a modification of FIG. 4.

A sealing member 7B has a surface formed to be flat, the surface being in contact with a first flow path 9B and a flow path case 6B. Similarly to FIG. 4, the flow path case 6B is formed to be recessed. As a result, not only an upper surface of the first flow path 9B but also a portion of a flow path wall of the first flow path 9B is installed in the flow path case 6B. This configuration facilitates manufacture of a semiconductor device.

Figure 6:
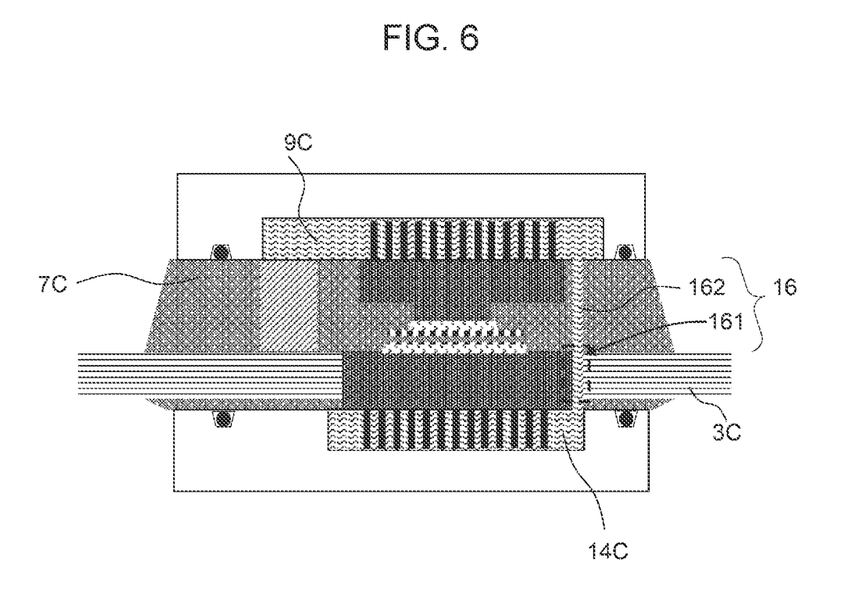
FIG. 6 is a view of a power semiconductor device according to a fifth embodiment of the present invention.

FIG. 6 is a view of a power semiconductor device according to a fifth embodiment of the present invention.

A substrate 3C has a substrate through hole 161 as a first through hole formed in order to make a first flow path 9C and a second flow path 14C conductive with each other, separately from a through hole provided for installing the power circuit. Similarly, also the sealing member 7C is provided with a sealing member through hole 162 as a second through hole in order to make the first flow path 9C and the second flow path 14C conductive with each other.

A through hole 16 configured with the substrate through hole 161 and the sealing member through hole 162 allows the refrigerant flowing in the first flow path 9C and the second flow path 14C to flow therethrough. In this manner, the refrigerant is allowed to flow into and out of the semiconductor device only by forming a flow path inlet and a flow path outlet each at one position, the flow path inlet and the flow path outlet being required to be provided in the first flow path 9C or the second flow path 14C.

Figure 7:
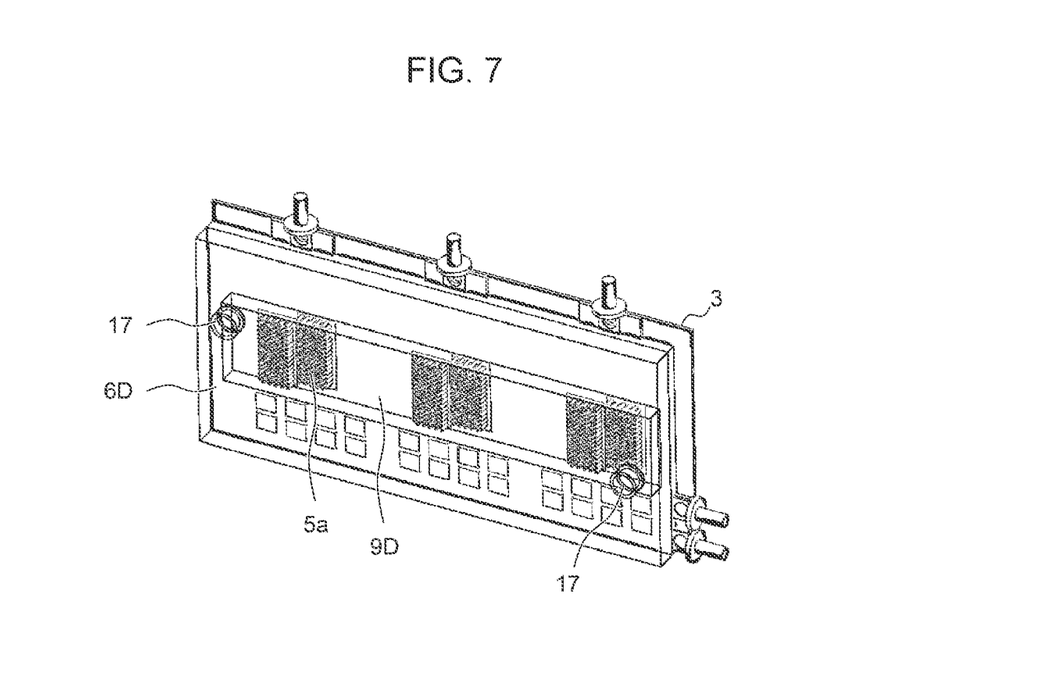
FIG. 7 is a perspective view of a power semiconductor device according to a sixth embodiment of the present invention.

FIG. 7 is a view of a power semiconductor device according to a sixth embodiment of the present invention. Although the conductive section 5a provided with the cooling fin 13 used in the description of FIGS. 3 to 6 is used also in FIG. 7 and the subsequent drawings, the cooling fin 13 may not be provided in the conductive section 5a, and the cooling wire 12 described in FIG. 2 may be provided instead of the cooling fin 13. The same applies to the conductive section 5b.

A first flow path 9D cools output three phases of a power conversion device, i.e., the conductive sections 5a for three phases of the power circuit. Each phase outputs an alternating current and is disposed in series with respect to the flow path portion 9D. The three phases of the power circuit are linearly disposed and disposed in series with respect to the flow path portion 9D. The flow path portion 9D is also molded in a linear shape. In this manner, a pressure loss of the refrigerant with respect to the flow path wall can be reduced. As a result, a flow rate of the refrigerant can be increased, so that the cooling effect is improved.

Refrigerant inlet and outlet 17 that are an inflow portion causing the refrigerant to flow into the flow path case 6D and an outflow portion causing the refrigerant to flow out of the flow path case 6D are installed in the flow path case 6D and are formed in a direction perpendicular to a surface of the substrate 3. By forming the refrigerant inlet and outlet 17 in the direction perpendicular to the substrate 3, dimensions of the refrigerant inlet and outlet 17 can be maximized, and the pressure loss with respect to the flow path wall can be reduced.

Figure 8:
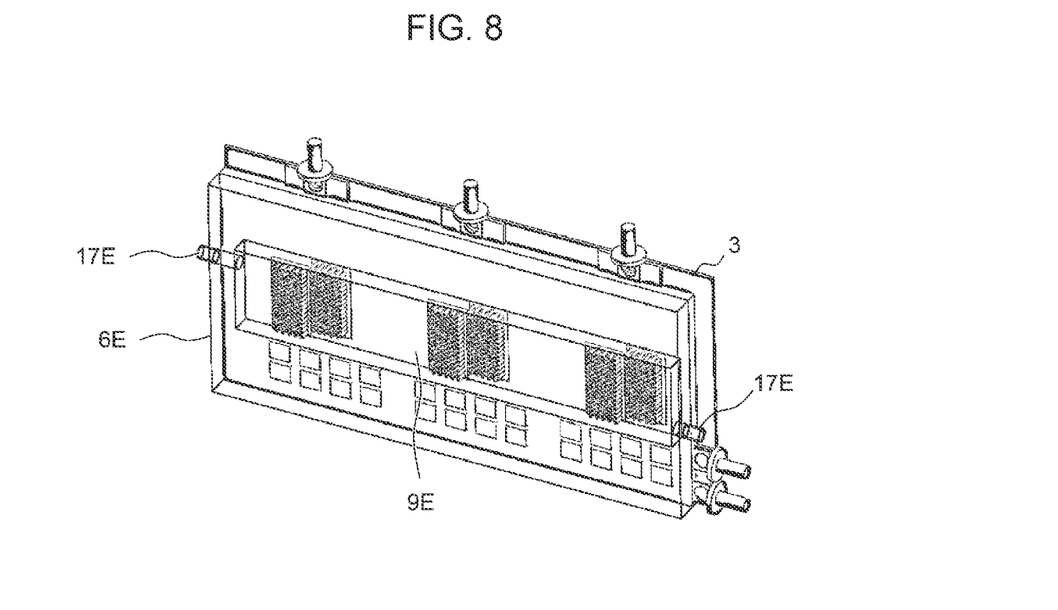
FIG. 8 is a perspective view of a power semiconductor device according to a seventh embodiment of the present invention.

FIG. 8 is a perspective view of a power semiconductor device according to a seventh embodiment of the present invention.

Refrigerant inlet and outlet 17E are formed in a direction horizontal to the surface of the substrate 3, and the refrigerant inlet/outlet 17E are disposed in a flow path case 6E that is a side wall of a first flow path 9E. This arrangement makes lamination of the power semiconductor device be thin, which contributes to down-sizing.

Figure 9:
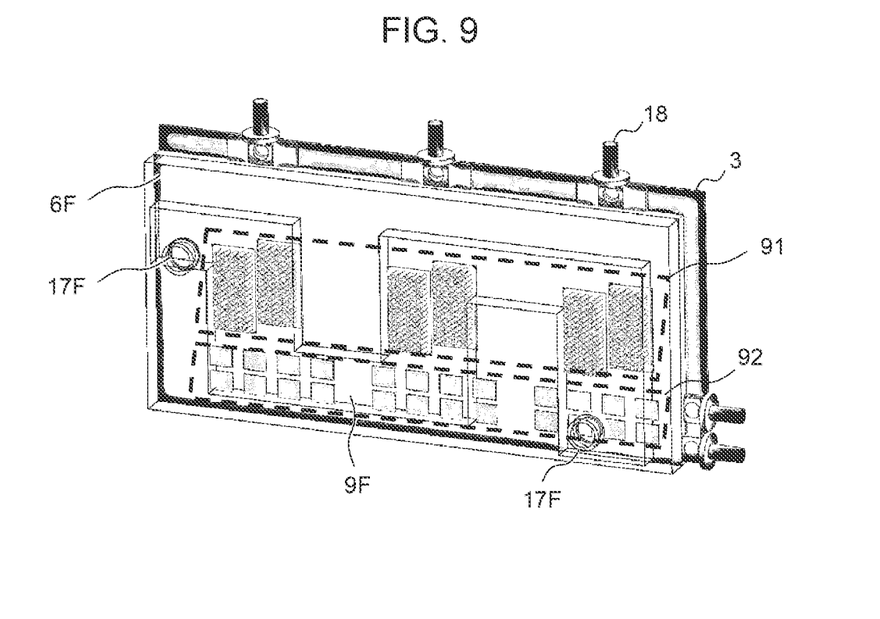
FIG. 9 is a perspective view of a power semiconductor device according to an eighth embodiment of the present invention.

FIG. 9 is a perspective view of a power semiconductor device according to an eighth embodiment of the present invention.

The three phases of the power circuit are disposed along a linear first row 91 in a longitudinal direction of the substrate 3, and the circuit component 8 is disposed along a second row 92 parallel to the first row. A first flow path 9F is formed so as not to extend along the first row 91, and cools the three-phase power circuit and the circuit component 8. In FIG. 9, the flow path portion 9F is formed in an S shape in a direction horizontal to the surface of the substrate 3. By forming the S-shaped flow path portion 9F, insulation between the three phases of the power circuit can be secured, and the circuit component 8 can be cooled by the same flow path portion 9F, so that the cooling effect can be improved.

While the refrigerant inlet and outlet 17F provided in the flow path case 6F are formed in the direction perpendicular to the surface of the substrate 3 as the S-shaped flow path portion 9F is formed, the refrigerant inlet and outlet may be formed in the direction horizontal to the surface of the substrate 3 as long as no problem in configuration is involved.

Figure 10:
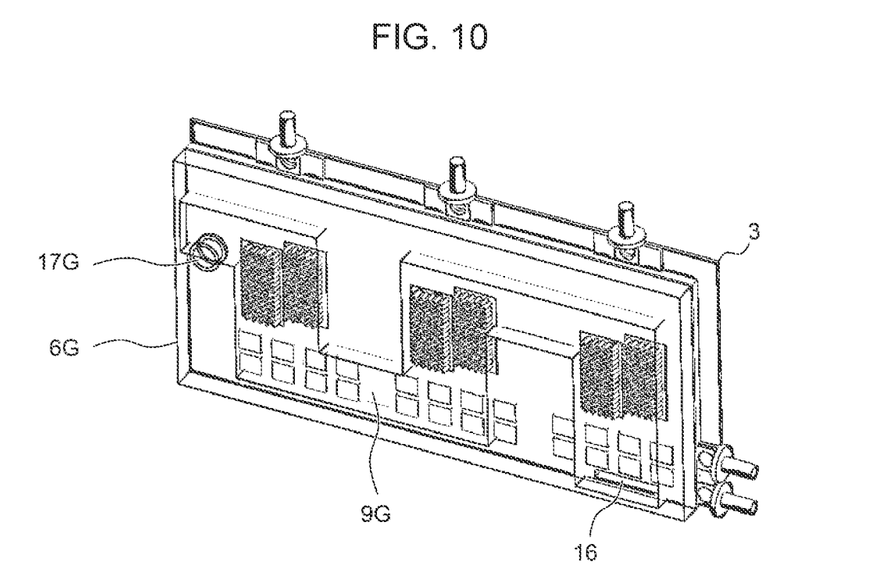
FIG. 10 is a perspective view of a power semiconductor device according to a ninth embodiment of the present invention.

FIG. 10 is a perspective view of a power semiconductor device according to a ninth embodiment of the present invention.

Although a refrigerant inlet 17G is formed in the direction perpendicular to the surface of the substrate 3, a refrigerant outlet 17G is not provided in the same flow path portion 9G, and is formed in a flow path portion provided on an opposite side surface of the substrate 3 through the through hole 16. As described in the foregoing, passing through the through hole 16 of the substrate 3 enables a flow path for cooling both surfaces of the substrate 3 to be simplified, and enables downsizing of the power semiconductor device and reduction in the number of components, resulting in reduction in a pressure loss.

Figure 11:
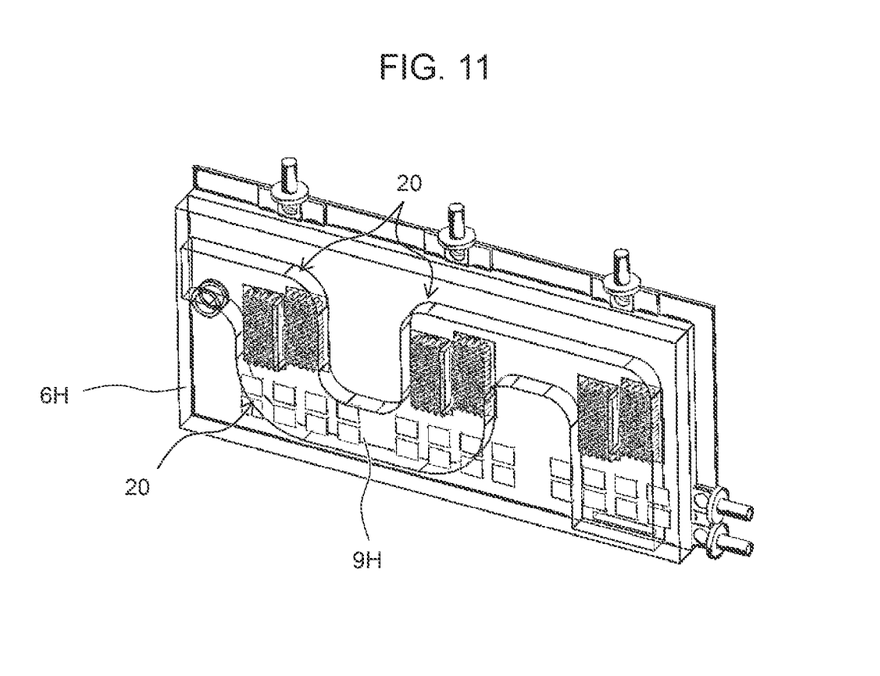
FIG. 11 is a modification of FIG. 10.

FIG. 11 is a modification of FIG. 10.

In a flow path portion 9H, a corner portion of the S-shaped flow path wall illustrated in FIGS. 9 and 10 is molded as a curved flow path wall 20 having a curved shape. As a result, since the curved flow path wall 20 formed in a meandering shape enables reduction of a pressure loss caused by the refrigerant with respect to a flow path case 6H and at the same time, since the curved flow path wall has a curved shape, a refrigerant flow velocity and the flow rate can be increased, so that the cooling effect is improved.

Figure 12:
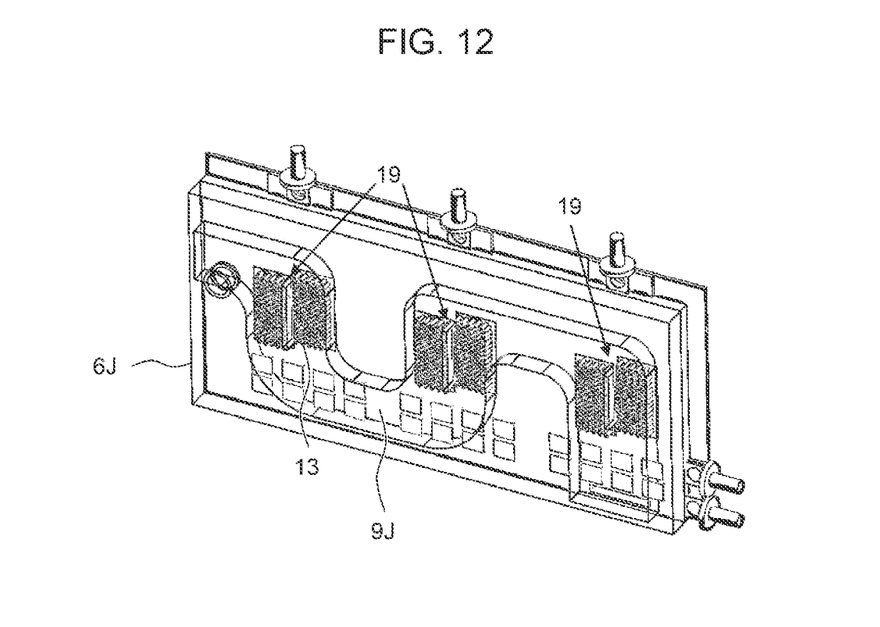
FIG. 12 is a perspective view of a power semiconductor device according to a tenth embodiment of the present invention.

FIG. 12 is a perspective view of a power semiconductor device according to a tenth embodiment of the present invention.

The cooling fins 13 are provided in the conductive sections of upper and lower arms of the three-phase power semiconductor, respectively. A partition plate 19 is disposed between the cooling fins 13 exposed in the flow path of a flow path case 6J. The partition plate 19 is formed in the sealing member 7 or the flow path case 6J. This secures an insulation distance between the power semiconductor devices. In addition, by controlling a flow of the refrigerant in a flow path portion 9J by the partition plate 19, the refrigerant is rectified, the flow velocity of the refrigerant on the surface of the conductive section is increased and uniformized, resulting in improving the cooling effect.

According to the first embodiment of the present invention described above, the following operations and effects are achieved.

(1) Provided are the power semiconductor element 1; the conductive sections 5a and 5b that transmit a main current of the power semiconductor element 1; the circuit component 8 that passes the main current or a control current that controls the power semiconductor element 1; the substrate 3 that supports the power semiconductor element 1, the conductive sections 5a and 5b, and the circuit component 8; and the sealing member 7 that seals the power semiconductor element 1, the conductive sections 5a and 5b, the circuit component 8, and the substrate 3. The power semiconductor element 1 and the conductive sections 5a and 5b constitute the power circuit that outputs an alternating current. The sealing member 7 forms the first flow path 9 for flowing a refrigerant. The first flow path 9 has the first region 10 thermally connected to the power circuit, and the second region thermally connected to the circuit component. In this manner, a power semiconductor device can be provided which enables both low inductance and down-sizing to be realized by achieving both improvement in a mounting density of a circuit component and improvement in cooling performance.

(2) The surface of the circuit component 8 is exposed from the sealing member 7 and forms a part of the bottom surface of the first flow path 9. In this manner, the cooling performance of the power circuit can be improved.

(3) The conductive section 5a, 5b has the exposed surface that is exposed from the sealing member 7, and the wire portion 12 having the bent portion is connected to the exposed surface. In this manner, the cooling performance of the power circuit can be improved.

(4) The conductive section 5a, 5b has the exposed surface that is exposed from the sealing member 7, and the pin fin 13 is provided on the exposed surface. In this manner, the cooling performance of the power circuit can be improved.

(5) The sealing member 7 forms the first flow path 9 on the first face 31 side of the substrate 3, and further forms the second flow path 14 on the second face 32 side of the substrate 3, and the second flow path 14 has the third region 15 thermally connected to the power circuit. In this manner, the power circuit can be cooled from both the faces.

(6) Each of the first flow path 9 and the second flow path 14 includes the sealing member 7 and the flow path cases 6 connected to the sealing member 7, the sealing member 7 forms at least a part of the bottom surfaces of the first flow path 9 and the second flow path 14, and the flow path cases 6 have the upper surfaces opposed to the bottom surfaces of the first flow path 9 and the second flow path 14, and the side surfaces connected to the upper surfaces. In this manner, the flow rate of the refrigerant flowing through the first flow path 9 or the second flow path 14 can be increased.

(7) The substrate 3 has the first through hole 161, and the sealing member 7 has the second through hole 162 that makes the first flow path 9 and the second flow path 14 conductive with each other and passes through the first through hole 161. With this configuration, the number of flow path inlets and outlets can be reduced by using the first flow path 9 and the second flow path 14 as one flow path. In addition, the cooling effect of the power circuit can be enhanced by the refrigerant passing through the first through hole 161 and the second through hole 162.

(8) The flow path case 6 includes the inflow portion 17 that causes the refrigerant to flow into the flow path 9 and the outflow portion 17 that causes the refrigerant to flow out of the flow path 9, the inflow portion 17 and the outflow portion 17 are formed in the first flow path 9, and three phases of the power circuit are linearly disposed in the first flow path 8. In this manner, the three-phase power circuit can be cooled efficiently.

(9) The inflow portion 17 and the outflow portion 17 are formed on the side wall of the first flow path 9. This arrangement enables lamination in a height direction of the power semiconductor device to be reduced, which contributes to down-sizing.

(10) The flow path case 6 includes the inflow portion 17 that causes the refrigerant to flow into the flow path case 6, and the outflow portion 17 that causes the refrigerant to flow out of the flow path case 6. The three phases of the power circuit are disposed along the linear first row 91. The circuit component 8 is disposed along the second row 92 that is parallel to the first row 91. The first flow path 9 is formed so as not to extend along the first row 91, and cools the three phases of the power circuit and the circuit component 8. This arrangement contributes to insulation between the power circuits and enables cooling of the power circuit and the circuit component 8 with one flow path.

(11) The sealing member 7 is provided between the three phases of the power circuit to form the first flow path 9 in a meandering shape. This arrangement enables reduction in a pressure loss with respect to the corner portion of the flow path 9.

(12) The power circuit has the partition portion 19 disposed between the upper and lower arms of the power circuit on the exposed surface that is exposed in the first flow path 9. In this manner, the refrigerant is rectified, and the flow velocity of the refrigerant on the surface of the conductive section is increased and uniformized, resulting in improving the cooling effect.

As described in the foregoing, deletion, placement by other configuration, and addition of other configuration can be made without departing from the technical idea of the present invention, and aspects thereof are also included in the scope of the present invention. Furthermore, a configuration combining the above-described embodiments and a plurality of modifications may be adopted.

REFERENCE SINGS LIST 1 power semiconductor element
2 solder
3, 3C substrate
31 first face
32 second face
4 seal member
5a, 5b conductive section
6, 6A, 6B, 6D, 6E, 6G, 6H, 6J flow path case
7, 7A, 7B, 7C sealing member
8 circuit component
9, 9A to J first flow path
91 first row
92 second row
10 first region
11 second region
12 cooling wire
13 cooling fin
14, 14A, 14C second flow path
15 third region
16 through hole
161 substrate through hole
162 sealing member through hole
17, 17E, 17F, 17G refrigerant inlet and outlet
19 partition plate

The invention claimed is:

1. A power semiconductor device, comprising:
a power semiconductor element;
a conductive section that transmits a main current of the power semiconductor element;
a circuit component that passes the main current or a control current that controls the power semiconductor element;
a substrate that supports the power semiconductor element, the conductive section, and the circuit component; and
a sealing member that seals the power semiconductor element, the conductive section, the circuit component, and the substrate, wherein
the power semiconductor element and the conductive section constitute a power circuit that outputs an alternating current,
the sealing member forms a first flow path for flowing a refrigerant, and
the first flow path has a first region thermally connected to the power circuit, and a second region thermally connected to the circuit component.

2. The power semiconductor device according to claim 1, wherein the circuit component has a surface that is exposed from the sealing member and forms a part of a bottom surface of the first flow path.

3. The power semiconductor device according to claim 1, wherein
the conductive section has an exposed surface that is exposed from the sealing member, and
a wire portion having a bent portion is connected to the exposed surface.

4. The power semiconductor device according to claim 2, wherein
the conductive section has an exposed surface that is exposed from the sealing member, and
a wire portion having a bent portion is connected to the exposed surface.

5. The power semiconductor device according to claim 1, wherein
the conductive section has an exposed surface that is exposed from the sealing member, and
a pin fin is provided on the exposed surface.

6. The power semiconductor device according to claim 2, wherein
the conductive section has an exposed surface that is exposed from the sealing member, and
a pin fin is provided on the exposed surface.

7. The power semiconductor device according to claim 1, wherein
the sealing member forms the first flow path on a first face side of the substrate, and further forms a second flow path on a second face side of the substrate, and
the second flow path has a third region thermally connected to the power circuit.

8. The power semiconductor device according to claim 7, wherein
each of the first flow path and the second flow path includes the sealing member and flow path cases connected to the sealing member,
the sealing member forms at least a part of bottom surfaces of the first flow path and the second flow path, and
the flow path cases have upper surfaces opposed to the bottom surfaces of the first flow path and the second flow path, and side surfaces connected to the upper surfaces.

9. The power semiconductor device according to claim 8, wherein
the substrate has a first through hole, and
the sealing member has a second through hole that makes the first flow path and the second flow path conductive with each other and passes through the first through hole.

10. The power semiconductor device according to claim 8, wherein
the flow path case includes an inflow portion that causes the refrigerant to flow into the flow path and an outflow portion that causes the refrigerant to flow out of the flow path,
the inflow portion and the outflow portion are formed in the first flow path, and
three phases of the power circuit are linearly disposed in the first flow path.

11. The power semiconductor device according to claim 10, wherein the inflow portion and the outflow portion are formed on a side wall of the first flow path.

12. The power semiconductor device according to claim 8, wherein
the flow path case includes an inflow portion that causes the refrigerant to flow into the flow path case, and an outflow portion that causes the refrigerant to flow out of the flow path case,
three phases of the power circuit are disposed along a linear first row,
the circuit component is disposed along a second row that is parallel to the first row, and
the first flow path is formed so as not to extend along the first row, and cools the three phases of the power circuit and the circuit component.

13. The power semiconductor device according to claim 12, wherein the sealing member is provided between the three phases of the power circuit to form the first flow path in a meandering shape.

14. The power semiconductor device according to claim 13, wherein the power circuit has a partition portion disposed between upper and lower arms of the power circuit on an exposed surface that is exposed in the first flow path.

* * * * *